(12) United States Patent
Eshel

(10) Patent No.: US 6,937,523 B2
(45) Date of Patent: Aug. 30, 2005

(54) NEIGHBOR EFFECT CANCELLATION IN MEMORY ARRAY ARCHITECTURE

(75) Inventor: Noam Eshel, Pardesiya (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 52 days.

(21) Appl. No.: 10/696,728

(22) Filed: Oct. 27, 2003

(65) Prior Publication Data

US 2005/0088878 A1 Apr. 28, 2005

(51) Int. Cl.$^7$ .............................................. G11C 16/06
(52) U.S. Cl. ........................... 365/185.28; 365/185.18; 365/185.21
(58) Field of Search ...................... 365/185.28, 185.18, 365/185.21, 189.07, 207, 233

(56) References Cited

U.S. PATENT DOCUMENTS 6,128,226 A   10/2000 Eitan et al.
6,178,118 B1 * 1/2001 Lin et al. ............... 365/185.28
6,351,415 B1   2/2002 Kushnarenko

* cited by examiner

*Primary Examiner*—David Lam
(74) *Attorney, Agent, or Firm*—Bever, Hoffman & Harms LLP; Patrick T. Bever

(57) ABSTRACT

Non-volatile memory (NVM) cells are sensed using a forced neighbor signal to eliminate improper readings generated by a neighbor effect. A selected NVM cell is sensed using a near-ground signal by applying a potential to a first terminal, coupling a second terminal to ground, and then decoupling the second terminal and comparing the resulting cell signal with a reference signal as both signals are developing (i.e., increasing from ground). A forced neighbor signal is applied to one more neighboring cells such that as the sensed cell signal develops (increases from ground), the forced neighbor signal develops at a similar rate, thereby maintaining a voltage across the neighboring cells close to zero and thus preventing leakage of the sensed cell signal through the neighbor cell(s). A dc sensing approach utilizes a current source and grounded resistor to minimize leakage through the neighbor cell(s).

24 Claims, 5 Drawing Sheets

NEIGHBOR EFFECT CANCELLATION IN MEMORY ARRAY ARCHITECTURE

FIELD OF THE INVENTION

The present invention relates to integrated circuit (IC) devices that include non-volatile memory (NVM) cells. More specifically, the present invention relates to methods and architectures for sensing the programmed state of NVM cells provided on such IC devices.

RELATED ART

Memory devices, such as random access memory (RAM), read-only memory (ROM), non-volatile memory (NVM) and like, are known in the art. These devices provide an indication of the data that is stored therein by providing an output electrical signal. In general, conventional sense amplifiers determine the logical value stored in a cell by comparing, after a suitable set-up period, this output electrical signal with a fixed threshold voltage level. If the output signal is above the threshold, the cell is determined to be erased (e.g., with a logical value of binary 1), and if the output signal is below the threshold, the cell is determined to be programmed (e.g., with a logical value of 0). The threshold level is typically set as a voltage level between the expected erased and programmed voltage levels that is high enough (or sufficiently far from both expected voltage levels) so that noise will not cause false results. Unfortunately, a high threshold level requires that the cell being sensed (read) be given a sufficient amount of time to fully develop its signal, thereby ensuring that, for an erased cell, the resultant signal has reached its full (high) voltage level. In order to achieve signal development in a reasonable amount of time, the entire array is first brought (or "equalized") to a medium voltage level such that the cell being sensed either increases (if it is erased) or decreases (if it is programmed). However, this equalization operation is time-consuming and requires a considerable amount of power.

U.S. Pat. No. 6,128,226, entitled "Method and apparatus for operating with a close to ground signal", by Dr. B. Eitan et al., discloses a method for sensing (reading) memory cells by sensing a signal from a cell that has risen from ground while the voltage level of the sensed cell signal is still close to the ground level, thereby reducing read time and power consumption when compared with conventional techniques. FIG. 1 shows a memory array 8 and a sense amplifier 20 that are disclosed by Dr. Eitan. Memory array 8 has a multiplicity of cells 10 that are organized into rows and columns. The gates of a single row of cells are connected to a word line WL, the sources of a column of cells are connected to a first bit line BL, and the drains of the column are connected to a second bit line. All the bit lines BL are connected to a Y decoder 12, which couples associated bit line pairs to facilitate read operations. For example, to read a cell 10A, Y decoder 12 couples bit line BLS to a supply line 14 that is maintained at a fixed voltage $V_{BL}$, and couples bit line BLD to a sensing line 16. When word line WLA is subsequently turned on, cell 10A responds and the voltage on sensing line 16 will develop accordingly, to be measured by sense amplifier 20. Sense amplifier 20 includes an amplifying comparator 22, a reference unit 24, and a timing unit 28. Amplifying comparator 22 receives the sensed cell signal $V_{CELL}$, which is developed on sensing line 16, a reference signal $V_{REF}$ from reference unit 24, and a control signal $Ø_2$ from timing unit 28, and produces a sense data output signal $V_{OUT}$. Connected to sensing line 16 is an N-channel Metal Oxide Semiconductor (NMOS) switching transistor 18 that is controlled by a control signal $Ø_1$. Switching transistor 18 connects sensing line 16 with either sense amplifier 20 or with a ground supply. When $Ø_1$ is high, switching transistor 18 is active (turned on), allowing connection between sensing line 16 and the ground supply, and thereby discharging cell 10A. However, when $Ø_1$ is low, switching transistor 18 is inactive (turned off), which permits data flow between sensing line 16 and sense amplifier 20. Signal $Ø_1$ is also provided to amplifying comparator 22, reference unit 24 and timing unit 28, where it functions in a similar manner to force the signals of interest to develop from the ground voltage.

FIGS. 2A through 2D are timing diagrams showing various signals used by the circuit shown in FIG. 1 during a cell sensing (read) operation. Referring to FIG. 2A, signal $Ø_1$ remains high during a time period 32, during which the source of sensed cell 10A is discharged (or "pre-charged") to ground. At the end of this discharge phase, signal $Ø_1$ changes state and remains in the changed state for a development phase 34 long enough for the cell signal $V_{CELL}$ to be developed (i.e., increase from the ground level) and read (i.e., compared with a reference voltage $V_{REF}$). At the end of development and read phases (i.e., at time T3), signal $Ø_1$ changes state again, after which, sense amplifier 20 provides a valid data output, indicative of the content of the cell 10A. FIG. 2B illustrates the operation of timing unit 28. A signal $V_{TIMER}$ begins developing from ground at the start of the development phase (i.e., at time T1), and when signal $V_{TIMER}$ reaches or exceeds a fixed voltage level $V_{DC\text{-}REF}$, timing unit 22 makes a change in control signal $Ø_2$, shown in FIG. 2C. Signal $Ø_2$ is active for an output period 38 (i.e., time T2 to T3, corresponding to the read phase) during which amplifying comparator 22 produces a signal representative of the data value stored by cell 10A. FIG. 2D shows the operation of amplifying comparator 22. At time T1, which occurs at the beginning of the discharge phase, reference unit 24 begins developing reference signal $V_{REF}$ from ground. At the same time, the cell 10A, which was discharged to ground, begins charging with the voltage on the supply line 14, thereby generating a signal $V_{CELL}$ on sensing line 16. Dr. Eitan teaches that reference signal $V_{REF}$ develops with the same characteristics and environment as the sensed cell signal $V_{CELL}$, but at a different rate. At time T2, the development phase (time period T1 to T2) ends and the read (output) phase begins (indicated by the high value 38 associated with control signal $Ø_2$), during which amplifying comparator 22 compares the voltage level $V_{CELL}$ on sensing line 16 with the reference signal $V_{REF}$ produced by reference unit 24. This comparison continues until the end of the read phase (i.e., at time T3). As indicated in FIG. 2D, when programmed, cell 10A exhibits high electrical resistance and, as such, provides low current and hence a slow voltage rise (indicated by voltage profile $V_{CELL\text{-}PROGRAMMED}$). When erased, cell 10A exhibits low electrical resistance and, as such, provides high current and hence a fast voltage rise (indicated by voltage profile $V_{CELL\text{-}ERASED}$). As can be seen in FIG. 2D, the reference signal $V_{REF}$ has a voltage profile between $V_{CELL\text{-}ERASED}$ and $V_{CELL\text{-}PROGRAMMED}$, and thus amplifying comparator 22 (FIG. 1) is able to determine the programmed state of cell 10A when the cell voltage (i.e., either $V_{CELL\text{-}ERASED}$ or $V_{CELL\text{-}PROGRAMMED}$) is close to ground (near ground) by comparing the cell voltage with the reference voltage $V_{REF}$.

A problem with the approach taught by Dr. Eitan is that it suffers from a "neighbor effect" that can cause the erroneous detection of a programmed state (logic 0) when a cell is actually erased (logic 1). Referring again to FIG. 1, during the sensing (reading) of cell 10A, a drain-to-source voltage develops across a neighbor cell 10N, which is connected between rightmost terminal of the sensed cell 10A and an adjacent bit line BLN. If neighbor cell 10N is erased, neighbor cell 10N will conduct some of the sensed cell current on bitline BLD to bit line BLN (assuming bit line BLN is maintained at a fixed voltage), thereby charging its own source/drain associated capacitance. This sensed cell current leakage can also pass to cell 10N's neighboring cell (i.e., cell 10N2), if it is also erased, and so on down the row of cells until a programmed cell is encountered. Therefore, the amount of leakage is difficult to predict and compensate for because the amount of leakage is at least partially dependent on the programmed state of neighbor cell 10N, neighbor's neighbor cell 10N2, and so on. Note also that the resistance of erased cells varies, and that in some instances the sensed cell signal $V_{CELL}$ of an erased cell may at a rate that is only slightly faster than the reference voltage $V_{REF}$. Thus, for any given cell sensing operation, the accurate reading of an erased cell depends upon how fully the sensed cell is erased, whether neighbor cell 10N is programmed or erased, and also on the programmed/erased state of the neighbor's neighbor (i.e., cell 10N2). In the worst case, if the sensed cell is only partially erased and the neighbor cells 10N and 10N2 are erased, the resulting current drawn through these neighbor cells can cause the signal on line BLD to increase more slowly than if the sensed cell were programmed, thereby possibly resulting in an erroneous "cell programmed" (logic 0) detection when cell 10A is in fact erased. For example, as indicated in FIG. 2D, if the neighboring cells draw sufficient current, an erased cell signal $V_{CE-NE}$ may remain below reference signal $V_{REF}$, thereby causing the sense amplifier to generate an erroneous "cell programmed" output signal.

What is needed is a method and apparatus for sensing the programmed state of memory cells that avoids the neighbor effect described above.

SUMMARY

The present invention is directed to a method and apparatus for sensing the programmed/erased state of a selected memory cell in which the neighbor effect (described above) is prevented by utilizing a forced neighbor signal to minimize the source-drain voltage across the selected memory cell's neighbor during the sensing operation, thereby minimizing leakage of the sensed cell signal through the neighbor cell.

According to a first embodiment of the present invention, a method is provided for sensing (reading) the programmed/erased state of a selected (first) non-volatile memory (NVM) cell within in an array of NVM cells using a close to ground (i.e., low voltage) signal. The array is arranged such that selected NVM cell is connected between a first bit line and a second bit line, and a neighbor (second) NVM cell is connected between the second bit line and a third bit line. During a first (discharge) phase of the cell sensing operation, the first bit line is coupled to a first voltage source, and the second and third bit lines are discharged (i.e., coupled to a ground source). During a second (development) phase of the cell sensing operation, the second and third bit lines are decoupled from the ground source, the second bit line is coupled to a sense amplifier, and the third bit line is coupled to a secondary signal source. Similar to the conventional method described above, upon decoupling the second bit line from the ground source, current flows through the selected NVM cell at a rate determined by the programmed/ erased state of the selected NVM cell (i.e., a relatively low current flow occurs when the selected NVM cell is programmed, and relatively high current flow occurs when the selected NVM cell is erased), thereby generating a sensed cell signal on the second bit line that develops (i.e. increases) from ground to the first bit line voltage at a corresponding rate. At the same time, the secondary signal source generates a forced neighbor signal on the third bit line. During a third (read) phase of the cell sensing operation, before the sensed cell signal and the forced cell signal have stabilized (i.e., while both signals are still developing (increasing) from ground), the sensed cell signal is compared with a reference signal to determine the programmed/erased state of the selected NVM cell.

According to an aspect of the present invention, during the development and read phases of the cell sensing operation (described above), the forced neighbor signal generated on the third bit line develops at a rate similar to that of the sensed cell signal in order to minimize current flow through the neighbor cell, thereby reducing leakage of the sensed cell signal during the read phase and reducing the chance of read errors due to the neighbor effect. The present inventor determined that discharging the third bit line during the discharge phase and generating even a small forced neighbor signal (current) on the third bit line during the development and read phases produces a reduction in the neighbor effect (i.e., leakage through the neighbor cell).

According to an embodiment of the present invention, an effective forced neighbor signal is generated by replicating the reference voltage signal, which is compared with the sensed cell signal during the read phase of the cell sensing operation. Those skilled in the art will recognize that current flow through the neighbor cell would be entirely prevented (thus entirely precluding errors due to the neighbor effect) when the forced neighbor signal exactly mirrors the sensed cell voltage. However, in practice, generating a forced neighbor signal that exactly mirrors the sensed cell voltage is difficult to achieve. In contrast, similar to the conventional methods described above, the reference signal is generated using, for example, a reference cell and/or resistors and capacitors such that it develops (i.e., increases from a ground, or zero volt level) during the development and read phases at a rate that is faster than the sensed cell signal associated with a programmed cell, but slower than the sensed cell signal associated with an erased cell, thereby facilitating near ground detection of the programmed/erased state of the first NVM cell. Generating the forced neighbor signal to substantially mirror the reference voltage provides an advantage in that the amount of neighbor effect reduction increases when the sensed cell signal becomes closer to the reference voltage signal. For example, under ideal conditions, a "fully erased" NVM cell passes a relatively high current that is significantly greater than the reference signal during the read phase of the cell sensing operation. However, in some instances, the erased state of an NVM cell may be less than ideal (i.e., such that it passes a relatively small amount of current). When this occurs, such a "partially erased" NVM cell produces a sensed cell signal that may still greater than the reference voltage, but not by a large margin. An advantage of generating the forced neighbor signal such that it substantially mirrors the reference voltage is that the reduction in source-drain voltage across the neighbor cell is greatest when it is most needed (i.e., when the sensed NVM cell is only partially erased and the sensed cell signal is relatively close to the reference signal). Conversely, when the sensed NVM cell is fully erased, the amount of current flow through the neighbor cell may be greater than in the partially erased case, but not by an amount sufficient to generate a neighbor effect error.

According to alternative embodiments of the present invention, the forced neighbor signal applied to the neighbor cell is generated using a dedicated reference cell, or using a current source, or using resistors connected to a voltage source. Those of ordinary skill in the art will recognize several other equivalent circuit structures capable of generating a suitable force neighbor signal that is similar to the reference signal used to determine the programmed/erased state of the first NVM cell.

According to another embodiment of the present invention, one or more additional forced neighbor signals are also applied to other cells in the same row as the sensed cell. Under ideal conditions the voltage across the neighbor NVM cell is substantially canceled by the forced neighbor signal applied to the third bit line (using the example established above). However, the voltage development of the third bit line (i.e., the non-sensed terminal of the neighbor NVM cell) also depends upon the conductivity of the "second neighbor" NVM cell, which is connected between the second terminal of the neighbor NVM cell and a fourth bit line of the array. In order to eliminate the neighbor effect caused by the second neighbor cell, the forced neighbor signal is coupled to both terminals of the second neighbor cell, thereby further preventing the undesirable neighbor effect. In one embodiment, separate current sources are used to generate the forced neighbor signals respectively applied to the third and fourth bit lines.

According to another embodiment of the present invention, the neighbor effect canceling aspects of the close-to-ground sensing arrangement are utilized in a "dc" sensing arrangement to provide benefits similar to those described above with reference to the close-to-ground sensing approach. The dc sensing method is applied to an array of NVM cells, which is similar to that described above and includes bit lines coupled to a sense amplifier/comparator via a decoder circuit. However, instead of using the three phase (discharging, development, and read) sensing operation associated with the close-to-ground arrangement, the dc sensing method uses a two phase process that includes a development (first) phase and a read (second) phase. At the beginning of the development phase, a first terminal (first bit line) of the selected NVM cell is coupled to a first voltage source, and a second terminal (second bit line) is coupled to the first input terminal of the sense amplifier/comparator. A cell (first) resistor is connected between the first input terminal of the sense amplifier and ground. This arrangement causes current to flow through the selected NVM cell, and to develop a corresponding cell signal across the cell resistor at a rate determined mainly by the programmed/erased state of the selected NVM cell and the size of the cell resistor. After a suitable development time period, the cell signal reaches either a relatively high voltage state (i.e., when the selected NVM cell is erased and the voltage across the selected NVM cell is relatively low) or a relatively low voltage state (i.e., when the selected NVM cell is programmed and a voltage across the selected NVM cell is relatively high). The dc sensing method then enters the read phase, during which the cell signal is compared with a suitable reference signal. The reference signal is generated, for example, by connecting a reference cell between the first voltage source and a second input terminal of the sense amplifier/comparator, and turning on the reference cell at the beginning of the development phase. The programmed/erased state of the reference cell is set such that the reference signal has a voltage level between that of the programmed cell signal and the erased cell signal. To prevent the neighbor effect from generating a false "cell programmed" reading (i.e., due to the increased load on the second bit line caused by one or more erased neighbor cells), a forced neighbor signal is generated on a third bit line of the array such that the voltage across a neighbor NVM cell (i.e., an NVM cell in the same row as the selected NVM cell and coupled between the second and third bit lines) is minimized. According to a specific embodiment disclosed below, the forced neighbor signal is generated by coupling the third bit line to a current source that is also connected to ground through a neighbor (second) resistor. The neighbor resistor and current source are selected (or "tuned") such that the forced neighbor signal has a current that is equal to the current generated through reference cell. Accordingly, when the threshold voltage of the selected NVM cell equals the threshold voltage of the reference cell, the drain-to-source voltage across the neighbor cell is zero. In this manner, the neighbor effect is eliminated in the dc sensing method in a manner similar to that described above with reference to the close-to-ground measuring method, and produces similar benefits.

The present invention will be more fully understood in view of the description and drawings provided below.

DETAILED DESCRIPTION

The present invention is directed to the operation of non-volatile memory (NVM) cells in a manner that prevents the erroneous neighbor effect described above. While the invention is described herein with specific reference to simplified NVM cells arranged in a simplified NVM array and read using simplified sense amplifier circuits, it is noted that the present invention may be applied to many types of NVM cells (e.g., EPROM, EEPROM, flash, one-time programmable (fuse) cells, and multi-bit NVM cells such as those disclosed in U.S. Pat. No. 6,011,725, which is incorporated herein by reference) be utilized in many circuit settings (e.g., as dedicated NVM devices, or part of a more complex integrated circuit). Accordingly, the memory circuits described below are intended to be illustrative and not limiting.

Figure 1:
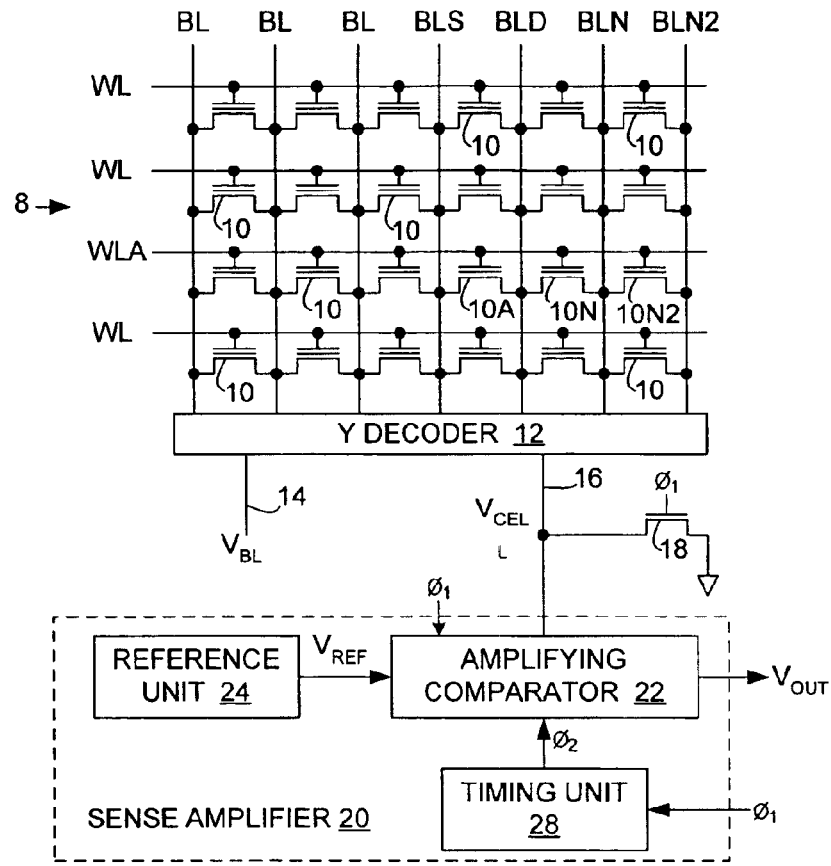
FIG. 1 is a schematic illustration of a conventional memory array and a sense amplifier.
Figure 2A:
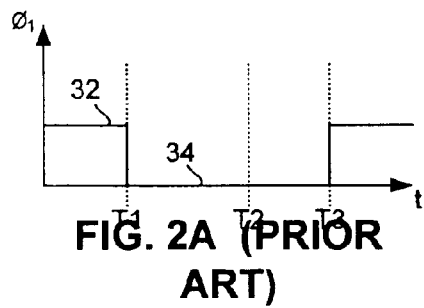
FIG. 2A is timing diagram showing a first control signal associated with a near-ground sensing procedure utilized in the memory array of FIG. 1.
Figure 2B:
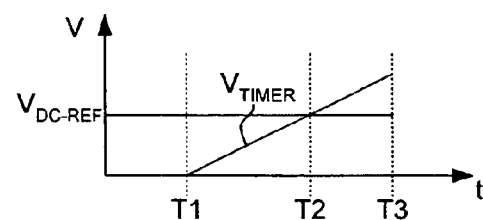
FIG. 2B is timing diagram showing a timing signal utilized during operation of the memory array of FIG. 1.
Figure 2C:
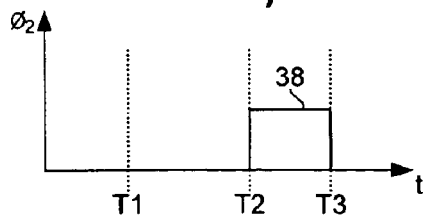
FIG. 2C is timing diagram showing a second control signal utilized during operation of the memory array of FIG. 1.
Figure 2D:
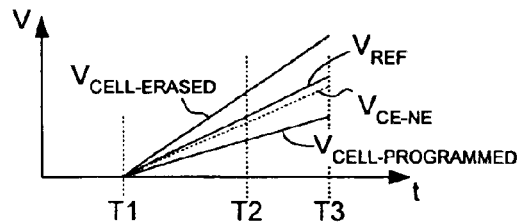
FIG. 2D is timing diagram showing voltage profiles of programmed and erased cells, along with a reference signal, utilized during operation of the memory array of FIG. 1.
Figure 3:
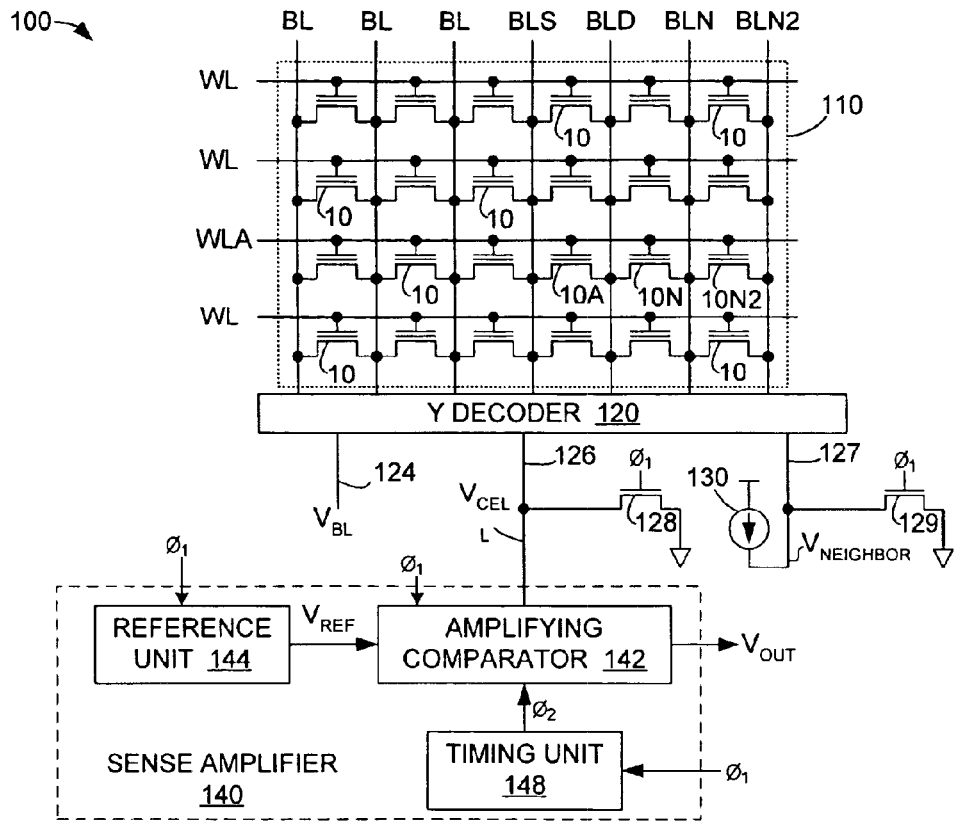
FIG. 3 is a schematic illustration of a memory array and a sense amplifier arrangement utilized in accordance with an embodiment of the present invention.

FIG. 3 shows a memory circuit 100 that utilizes a near-ground sensing procedure according to a first embodiment of the present invention. Memory circuit 100 includes an array 110, a Y decoder (e.g., a multiplexer) 120, and a sense amplifier 140 that operate in a manner similar to that disclosed in U.S. Pat. No. 6,128,226 (discussed above and incorporated herein by reference in its entirety).

Memory array 110 includes NVM cells 10 that are arranged into rows and columns. The gates of each row of NVM cells are connected to a word line WL, and the source and drain terminals of each NVM cell are connected to associated bit lines BL. For example, (first) NVM cell 10A has a gate terminal connected to word line WLA, a first (source) terminal connected to a (first) bit line BLS, and a second (drain) terminal connected to a (second) bit line BLD. A neighbor (second) NVM cell 10N, which is located immediately adjacent to NVM cell 10A, has a gate terminal connected to word line WLA, a first terminal connected to bit line BLD, and a second terminal connected to a (third) bit line BLN. Similarly, a neighbor (third) NVM cell 10N2, which is located immediately adjacent to neighbor NVM cell 10N, has a gate terminal connected to word line WLA, a first terminal connected to bit line BLN, and a second terminal connected to a (fourth) bit line BLN2.

The bit lines BL of memory array 110 are connected to Y decoder 120, which selectively couples the bit lines of array 110 to either a signal source, or to sense amplifier 140 via a signal line 126. As indicated on the lower portion of Y decoder 120, the signal sources selectively coupled to the bit lines include a (first) voltage source that generates a non-zero voltage signal $V_{BL}$ on a signal line 124, a first N-channel Metal Oxide Semiconductor (NMOS) select transistor 128 for selectively coupling signal line 126 to ground, a (secondary) signal source 130 that is coupled to the bit lines via another signal line 127, and a second NMOS select transistor 129 for selectively coupling signal line 127 to ground. A control circuit (not shown) controls Y decoder 120 to selectively couple bit lines to signal line 124, sensing line 126, and signal line 127. In addition, this control circuit generates control signal $\emptyset_1$, which controls select transistors 128 and 129 to couple selected bit lines to ground. In particular, when control signal $\emptyset_1$ is high, select transistors 128 and 129 are turned on, thereby coupling sensing line 126 and signal line 127 to ground, and pulling down associated bit lines that are coupled to sensing line 126 and signal line 127 via Y decoder 120. Conversely, when control signal $\emptyset_1$ is low, select transistors 128 and 129 are turned off, which permits data flow between a first selected bit line and sense amplifier 140 via sensing line 126, and between a second selected bit line and signal source 130 via signal line 127.

Figure 4A:
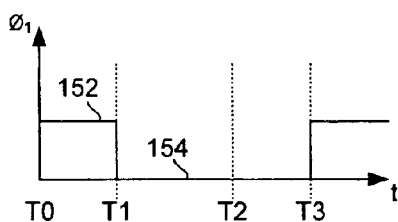
FIG. 4A is timing diagram showing a first control signal associated with a near-ground sensing procedure utilized in the memory array of FIG. 3.

Sense amplifier 140, which is coupled to Y decoder 120 via signal line 126, includes an amplifying comparator 142, a reference unit 144, and a timing unit 148. Similar to the method described in U.S. Pat. No. 6,128,226, amplifying comparator 142 receives cell signal $V_{CELL}$ generated on sensing line 126 by a selected NVM cell, control signal $\emptyset_1$, a reference signal $V_{REF}$ from reference unit 144, and a control signal $\emptyset_2$ from timing unit 148. Amplifying comparator 142 utilizes these signals to produce a data output signal $V_{OUT}$ having a voltage level that indicates a programmed/erased state of the selected NVM cell. Reference unit 144 receives control signal $\emptyset_1$, and generates reference signal $V_{REF}$ (shown in FIG. 4D) that develops from ground in the manner described below when control signal $\emptyset_1$ switches low. Timing unit 148 also receives control signal $\emptyset_1$, and generates control signal $\emptyset_2$ according to the timing diagram shown in FIG. 4C and described below.

A method for performing near-ground sensing (reading) of NVM cell 10A (FIG. 3) according to an embodiment of the present invention will now be described.

To access NVM cell 10A for this sensing operation, the control circuit (not shown) of memory circuit 100 controls Y decoder 120 to couple bit line BLS to signal line 124 (i.e., to fixed voltage $V_{BL}$), to couple bit line BLD to sensing line 116, and to couple neighbor line BLN to signal line 127 during a discharge phase of the sensing operation. In an optional embodiment, one or more additional bit lines (e.g., bit line BLN2) may be coupled by Y decoder 120 to signal line 127 for reasons discussed below. In addition to controlling Y decoder 120, the control circuit of memory circuit 100 generates control signal $\emptyset_1$ according to the timing diagram shown in FIG. 4A, which is utilized in the manner described below to perform near-ground sensing of selected NVM cell 10A.

Figure 4B:
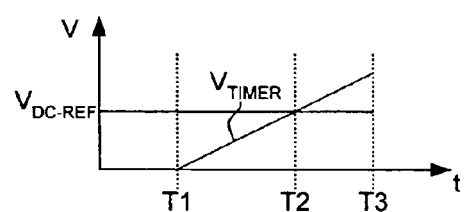
FIG. 4B is timing diagram showing a timing signal utilized during operation of the memory array of FIG. 3.
Figure 4C:
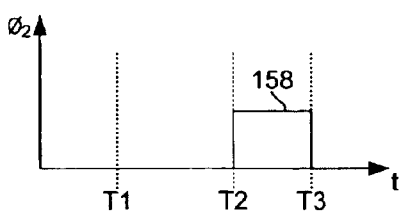
FIG. 4C is timing diagram showing a second control signal utilized during operation of the memory array of FIG. 3.
Figure 4D:
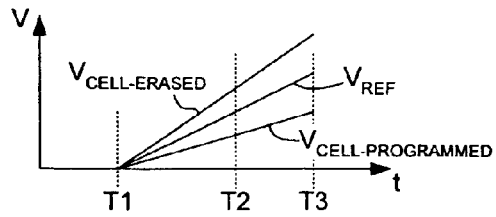
FIG. 4D is timing diagram showing voltage profiles of programmed and erased cells, along with a reference signal, utilized during operation of the memory array of FIG. 3.
Figure 5A:
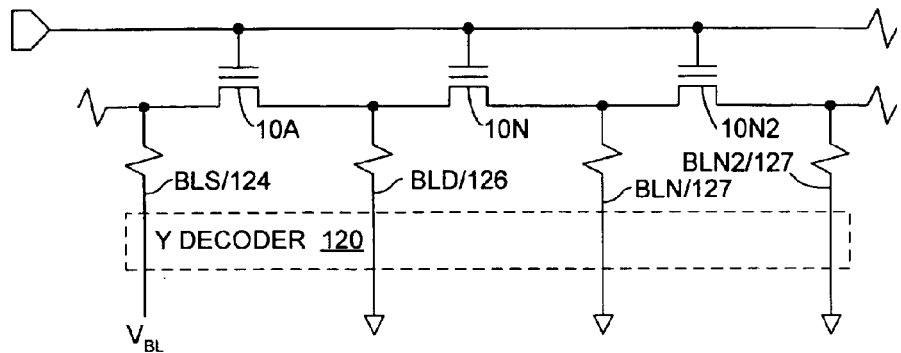
FIG. 5A is a simplified schematic diagram showing an equivalent memory array circuit generated during a discharge (first) phase of the near-ground sensing procedure according to an embodiment of the present invention.

During the discharge (first) phase (i.e., times T0 to T1 in FIGS. 4A to 4D), control signal $\emptyset_1$ is driven high, thereby turning on select transistors 128 and 129. FIG. 5A is a simplified circuit diagram showing an equivalent circuit generated during the discharge phase. Note that turning on select transistor 128 couples bit line BLD to ground via sensing line 126, and turning on select transistor 129 couples bit line BLN (and, if applicable, bit line BLN2) to ground via signal line 127, thereby discharging these bit lines. Note also that the voltage on bit line BLS is stabilized at fixed voltage $V_{BL}$ at time T1.

Figure 5B:
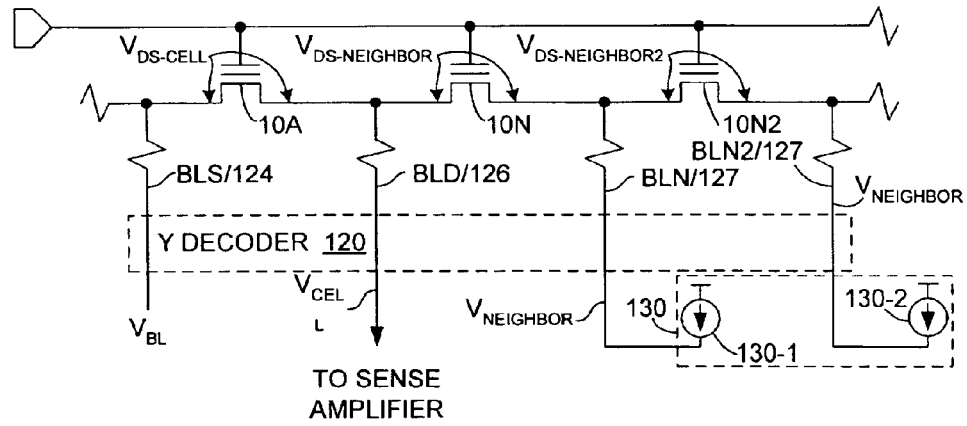
FIG. 5B is a simplified schematic diagram showing an equivalent memory array circuit generated during development (second) and read (third) phases of the near-ground sensing procedure of the present invention.

Referring again to FIG. 4A, during a development (second) phase 154 of the cell sensing operation (i.e., time T1 to T2 in FIGS. 4A–4D), control signal $Ø_1$ is driven low, thereby turning off select transistors 128 and 129 and decoupling bit lines BLD and BLN (and BLN2, if applicable) from ground. Referring to FIG. 4B, timing unit 148 responds to the low-going control signal $Ø_1$ to initiate a signal $V_{TIMER}$, which also begins developing from ground at time T1. As indicated by the resulting equivalent circuit shown in FIG. 5B, turning off select transistor 128 effectively couples NVM cell 10A between voltage signal $V_{BL}$ (via bit line BLS and signal line 124) and sense amplifier 140 (via bit line BLD and sensing line 126). Accordingly, starting at time T1, the cell signal $V_{CELL}$ on bit line BLD and sensing line 126 begins to increase from ground (0 volts) in response to the current passing through NVM cell 10A from bit line BLS. The development rate (i.e., increase) of cell signal $V_{CELL}$ is determined by the programmed/erased state of NVM cell 10A. In particular, as indicated in FIG. 4D, when NVM cell 10A is programmed, the resistance provided by NVM cell 10A is relatively high, thereby resulting in a relatively low cell current and the relatively slow developing programmed cell signal $V_{CELL-PROGRAMMED}$. Conversely, when NVM cell 10A is erased, the resistance generated by NVM cell 10A is relatively low, thereby resulting in a relatively high cell current and the relatively rapid developing erased signal $V_{CELL-ERASED}$. When signal $V_{TIMER}$ reaches or exceeds a fixed reference voltage $V_{DC-REF}$ (i.e., at time T2; FIG. 4B), timing unit 148 switches signal $Ø_2$ high (shown in FIG. 4C). Signal $Ø_2$ is active for a read (third) period 158, during which amplifying comparator 142 produces a signal representative of the data value stored by NVM cell 10A. In addition, during the read phase (beginning at time T2), cell signal $V_{CELL}$, which is generated on bit line BLD, is compared with reference signal $V_{REF}$, which is generated by reference unit 144, to determine the programmed/erased state of NVM cell 10A. As indicated in FIG. 4D, similar to the conventional methods described above, reference signal $V_{REF}$ develops from ground beginning at time T1 at a rate that is faster than the programmed cell signal $V_{CELL-PROGRAMMED}$ and slower than the erased cell signal $V_{CELL-ERASED}$, thereby facilitating near ground detection of the programmed/erased state of the first NVM cell. Accordingly, as indicated in FIG. 4D, the programmed/erased state of NVM cell 10A is easily determined by comparing the instantaneous voltage levels of reference signal $V_{REF}$ and the programmed/erased cell signal.

Referring again to FIG. 5B, according to the present invention, the low control signal $Ø_1$ (turned off select transistor 129) also couples bit line BLN (via Y decoder 140 and signal line 127) to signal source 130 (which in one embodiment includes separate current sources 130-1 and 130-2). Signal source 130 is constructed using known techniques to generate a forced neighbor (secondary) signal $V_{NEIGHBOR}$ on bit line BNL. According to an aspect of the present invention, forced neighbor signal $V_{NEIGHBOR}$ develops at a rate similar to that of the sensed cell signal $V_{CELL}$ in order to minimize current flow through neighbor cell 10N, thereby reducing leakage of sensed cell signal $V_{CELL}$ during the read phase, and reducing the chance of read errors due to the neighbor effect. Those skilled in the art will recognize that leakage through neighbor cell 10N would be entirely prevented if forced neighbor signal $V_{NEIGHBOR}$ exactly mirrors sensed cell voltage $V_{CELL}$ (i.e., such that the drain-source voltage across neighbor cell 10N remains zero during the read phase of the cell sensing operation). However, in practice, generating forced neighbor signal $V_{NEIGHBOR}$ such that it exactly mirrors sensed cell voltage $V_{CELL}$ is difficult to achieve. Moreover, generating even a small forced neighbor signal $V_{NEIGHBOR}$ (e.g., a current of only a few micro-amperes when the sensed cell signal $V_{CELL}$ is approximately 20 micro-amperes) on bit line BLN during the development and read phases (i.e., time period T1–T3) was found to produce a measurable reduction in the neighbor effect.

Figure 6:
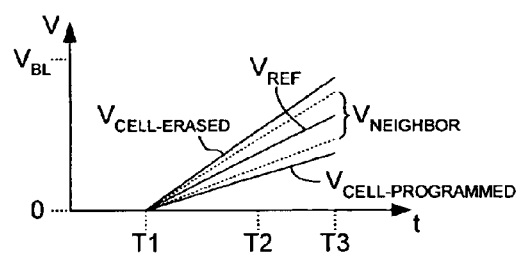
FIG. 6 is timing diagram showing voltage profiles of programmed and erased cells, along with a forced neighbor signal, that are utilized in the memory array of FIG. 3 according to an embodiment of the present invention.

FIG. 6 is a timing diagram showing forced neighbor signal $V_{NEIGHBOR}$ according to a specific embodiment of the present invention in which neighbor signal $V_{NEIGHBOR}$ is generated such that it increases from ground at a (third) rate that is between the relatively slow (first) rate associated with programmed cell signal $V_{CELL-PROGRAMMED}$, and the relatively fast (second) rate associated with erased cell signal $V_{CELL-ERASED}$). When generated in this range, the present inventor has found at least some reduction in the neighbor effect. Further improvement (i.e., three- to six-times) was found by restricting the forced neighbor signal $V_{NEIGHBOR}$ within ±50% of reference signal $V_{REF}$. However, substantially greater reductions in the neighbor effect (i.e., a 25× decrease in current through neighbor cell 10N, as compared to grounding bit line BLN during the development and read phases) was realized when forced neighbor signal $V_{NEIGHBOR}$ substantially mirrored reference signal $V_{REF}$. The reason for this substantial improvement is described below with reference to FIGS. 7A and 7B.

Figure 7A:
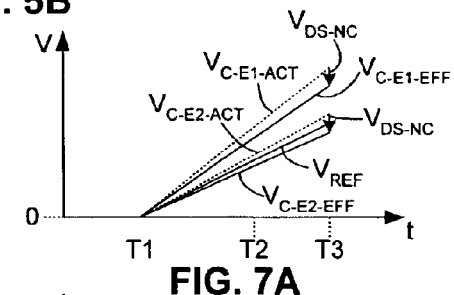
FIG. 7A is a timing diagram illustrating the neighbor effect on a sensed cell signal.

FIG. 7A is a timing diagram showing two sensed cell signals associated with erased cells. Under ideal conditions, a "fully erased" NVM cell passes a relatively high current, and produces a sensed cell signal $V_{C-E1-ACT}$ that is significantly greater than reference signal $V_{REF}$ during the read phase of the cell sensing operation. Even after a significant signal loss $V_{DS-NC}$ (indicated by arrow) due to current leakage through the neighbor cell, the effective sensed cell signal $V_{C-E1-EFF}$ remains well above reference signal $V_{REF}$, and an accurate cell sensing operation is reliably performed. However, in some instances, the erased state of an NVM cell may be less than ideal (e.g., when the erase operation is not performed a sufficiently long period of time), thereby resulting in higher resistance and causing the cell to pass a relatively small amount of current during the read phase. This case is illustrated by sensed cell signal $V_{C-E2-ACT}$, which is closer to reference signal $V_{REF}$ during the read phase of the cell sensing operation, but can still generate an accurate "cell erased" reading when the neighbor effect is minimal. However, in cases where neighbor cell 10N is erased and the neighbor effect is significant, the effective sensed cell signal $V_{C-E2-EFF}$ can drop below reference signal $V_{REF}$, which can produce an erroneous "cell programmed" reading.

Figure 7B:
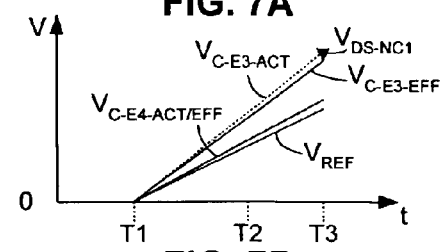
FIG. 7B is a timing diagram illustrating a reduction in the neighbor effect in response to a forced neighbor signal generated in accordance with an embodiment of the present invention.

FIG. 7B illustrates a beneficial effect of maintaining the forced neighbor signal $V_{NEIGHBOR}$ such that it is substantially equal to reference signal $V_{REF}$. Under the ideal conditions mentioned above, the "fully erased" NVM produces a sensed cell signal $V_{C-E3-ACT}$ that is significantly greater than reference signal $V_{REF}$ during the read phase of the cell sensing operation, even after factoring in loss $V_{DS-NC1}$ due to current flow through neighbor cell 10N (indicated by dashed line $V_{C-E3-EFF}$). Note that loss $V_{DS-NC1}$ is less than that of the case shown in FIG. 7A (where no forced neighbor signal is used), but is relatively large due to the relatively large difference the "fully erased" sensed cell signal and forced neighbor signal $V_{NEIGHBOR}$. However, when the sensed cell is not fully erased and the difference between the sensed cell signal $V_{C-E4-ACT/EFF}$ is relatively small, the difference between sensed cell signal $V_{C-E4-ACT/EFF}$ and forced neighbor signal $V_{NEIGHBOR}$ also becomes relatively small, thereby preventing leakage through neighbor cell 10N and preventing the neighbor effect.

According to an embodiment of the present invention, forced neighbor source 130 uses a dedicated reference cell to generate forced neighbor signal $V_{NEIGHBOR}$. Alternatively, forced neighbor source 130 may utilize a current source or a voltage source/resistor circuit to produce a suitable forced neighbor signal $V_{NEIGHBOR}$. Moreover, those of ordinary skill in the art will recognize several other equivalent circuit structures may also be utilized. Further, as suggested by comparing FIGS. 4D and 6, reference signal $V_{REF}$ and forced neighbor signal $V_{NEIGHBOR}$ may be generated using similar circuits, or possibly even the same circuit.

Referring again to FIGS. 5A and 5B, under ideal conditions, forced neighbor signal $V_{NEIGHBOR}$ develops at the same rate as that of reference signal $V_{REF}$. However, the voltage development on bit line BLN also depends upon the conductivity of the "second neighbor" NVM cell 10N2, which connected between bit line BLN (i.e., the second terminal of neighbor NVM cell 10N) and bit line BLN2. Therefore, according to another embodiment of the present invention, in order to eliminate the possible neighbor effect caused by second neighbor cell 10N2, forced neighbor signal $V_{NEIGHBOR}$ is also coupled to both terminals of second neighbor cell 10N2, thereby further preventing the undesirable neighbor effect by minimizing a voltage across second neighbor cell 10N2.

Figure 8:
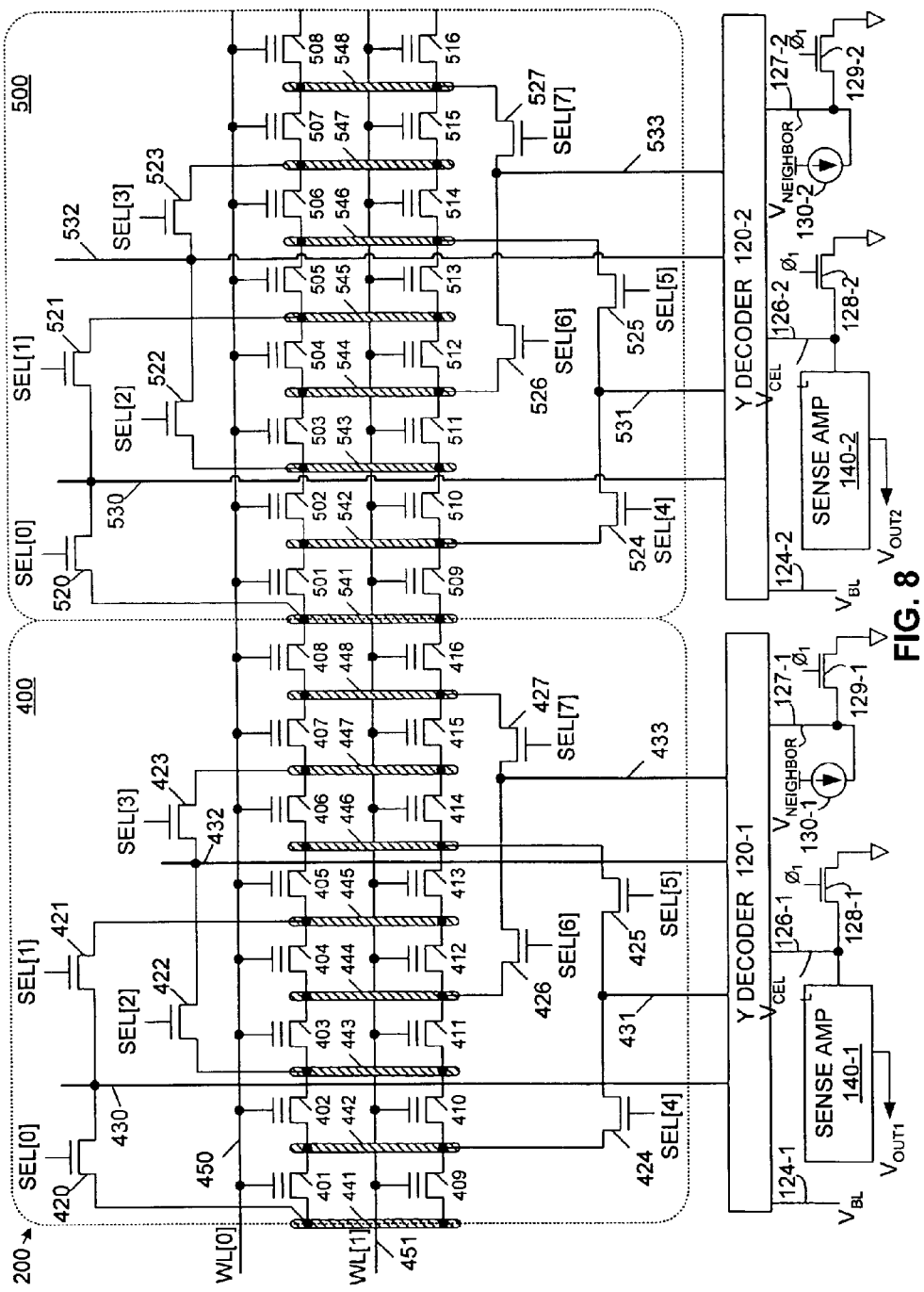
FIG. 8 is a simplified schematic diagram showing a memory array and a sense amplifier arrangement utilized in accordance with another embodiment of the present invention.

FIG. 8 is a circuit diagram showing a symmetrical non-volatile memory array 200 formed in accordance with another embodiment of the present invention. Non-volatile memory array 200 is fabricated in a semiconductor substrate using techniques similar to those described in U.S. Pat. No. 6,351,415, which is incorporated herein by reference in its entirety. Array 200 includes a pair of repeatable memory tiles 400 and 500, which are respectively connected to Y decoder circuits 120-1 and 120-2. Memory tile 400 includes non-volatile memory transistors 401–416, select transistors 420–427, metal bit lines 430–433, and diffusion bit lines 441–448. Metal bit lines 430–433 are connected to Y decoder 120-1. Similarly, memory tile 500 includes non-volatile memory transistors 501–516, select transistors 520–527, metal bit lines 530–533, and diffusion bit lines 541–548. Metal bit lines 530–533 are connected to Y decoder 120-2. Memory tiles 400 and 500 share word lines 450–451 and diffusion bit line 541. The construction of memory tiles 400 and 500 is identical. Thus, array 200 can easily be expanded along the horizontal and vertical axes of FIG. 8. Non-volatile memory transistors 401–408 and 501–508 are located in a first row of array 200. The control gates of transistors 401–408 and 501–508 are coupled to word line 450. Non-volatile memory transistors 409–416 and 509–516 are located in a second row of array 200. The control gates of transistors 409–416 and 509–516 are coupled to word line 451. Non-volatile memory transistors 401–416 and 501–516 are substantially identical to non-volatile memory transistors described in U.S. Pat. No. 6,351,415. Similarly, diffusion bit lines 441–448 and 541–548 are formed by conductively doping regions of the semiconductor substrate.

Select transistors 420–427 and 520–527 are used to couple diffusion bit lines 441–448 and 541–548 to metal bit lines 430–433 and 530–533, which in turn are coupled via Y decoders 120-1 and 120-2 to perform near-ground sensing operations according to the present invention. More specifically, within memory tile 400, select transistors 420 and 421 couple diffusion bit lines 441 and 445, respectively, to metal bit line 430. Similarly, select transistors 422 and 423 couple diffusion bit lines 443 and 447, respectively, to metal bit line 432. Select transistors 424 and 425 couple diffusion bit lines 442 and 446, respectively, to metal bit line 431. Finally, select transistors 426 and 427 couple diffusion bit lines 444 and 448, respectively, to metal bit line 433. Metal bit lines 430–433 are in turn connected to Y-decoder 120-1, which is controlled in the manner described above to selectively couple these bit lines to signal $V_{BL}$ via signal line 124-1, sense amplifier 140-1 via sensing line 126-1 (or via select transistor 128-1 to ground), and secondary signal source 130-1 via signal line 127-1 (or to ground via select transistor 129-1). Similar connections are provided between metal bit lines 530–533 and diffusion bit lines 541–548 in memory tile 500. Metal bit lines 530–533 are in turn connected to Y-decoder 120-2, which is controlled in the manner described above to selectively couple these bit lines to signal $V_{BL}$ via signal line 124-2, sense amplifier 140-2 via sensing line 126-1 (or via select transistor 128-1 to ground), and secondary signal source 130-2 via signal line 127-2 (or to ground via select transistor 129-2). With this construction, near-ground sensing of selected cells in memory array 200 is performed in a manner similar to that described above.

Methods for fabricating the various elements of memory array 200 (i.e., non-volatile memory transistors, diffusion bit lines, metal bit lines and select transistors) are described in commonly owned, co-pending U.S. patent application Ser. No. 09/244,316, which is hereby incorporated by reference in its entirety. Steps of programming and erasing such non-volatile memory transistors are known to those skilled in the art, and details concerning programming and erasing particular non-volatile memory transistors can be found in commonly owned U.S. Pat. Nos. 6,081,456 and 6,181,597, which are hereby incorporated by reference.

Figure 9:
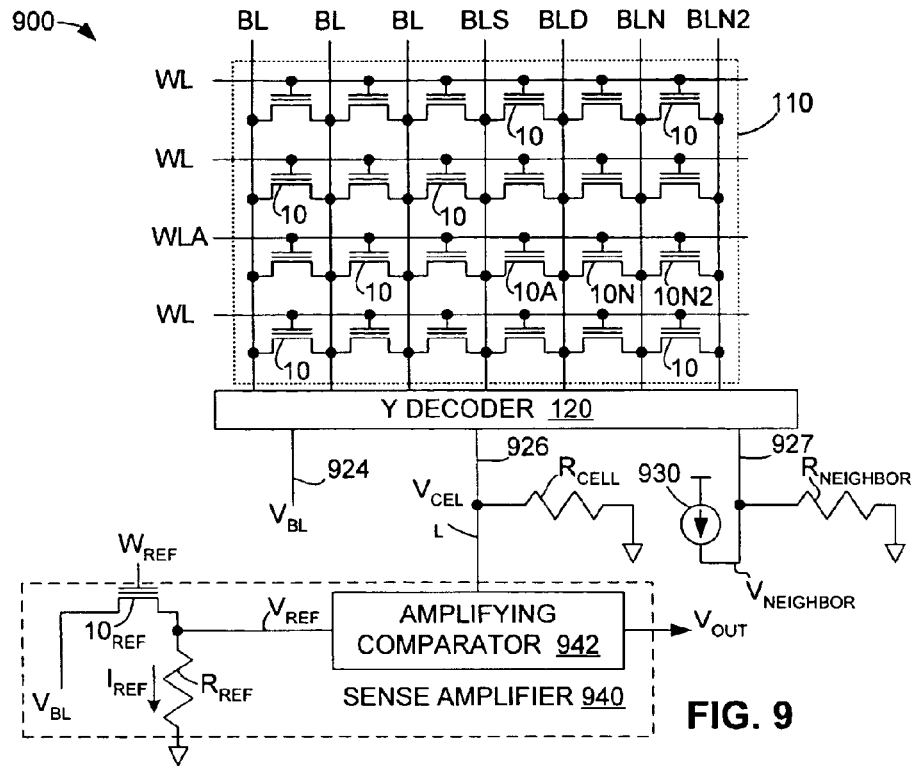
FIG. 9 is a schematic illustration of a memory array and a sense amplifier arrangement utilized in accordance with another embodiment of the present invention.

FIG. 9 shows a memory circuit 900 that utilizes a dc sensing procedure according to another embodiment of the present invention. For brevity, memory circuit 900 utilizes array 110 and Y decoder 120, which are described above and will not be further described here.

Similar to the near-ground sensing embodiment (described above), Y decoder 120 couples the bit lines of array 110 to either a fixed voltage $V_{BL}$ via a source line 924, to a sense amplifier 940 via a signal line 926, or to a current source 930 via a signal line 927. A cell (first) resistor $R_{CELL}$ has a first terminal connected to signal line 926, and a second terminal connected to ground. Similarly, a neighbor (second) resistor $R_{NEIGHBOR}$ has a first terminal connected to signal line 927, and a second terminal connected to ground. Sense amplifier 940 includes an amplifying comparator 942 having first terminal connected to sensing line 926 for receiving cell signal $V_{CELL}$, and a second terminal connected to a reference cell $10_{REF}$, which has a second terminal connected to fixed voltage $V_{BL}$. In addition, a reference (third) resistor $R_{REF}$ has a first terminal connected to the second terminal of reference cell $10_{REF}$, and a second terminal connected to ground.

A method for performing dc sensing (reading) of NVM cell 10A (FIG. 9) utilizes a two-phase process that includes a development (first) phase and a read (second) phase.

Figure 10:
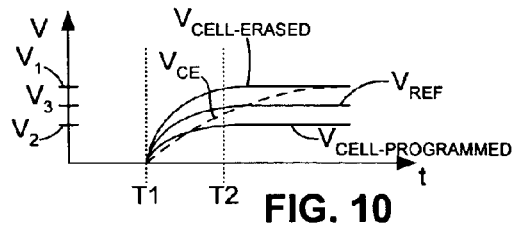
FIG. 10 is timing diagram showing various signals associated with a dc sensing procedure utilized in the memory array of FIG. 9.
Figure 11:
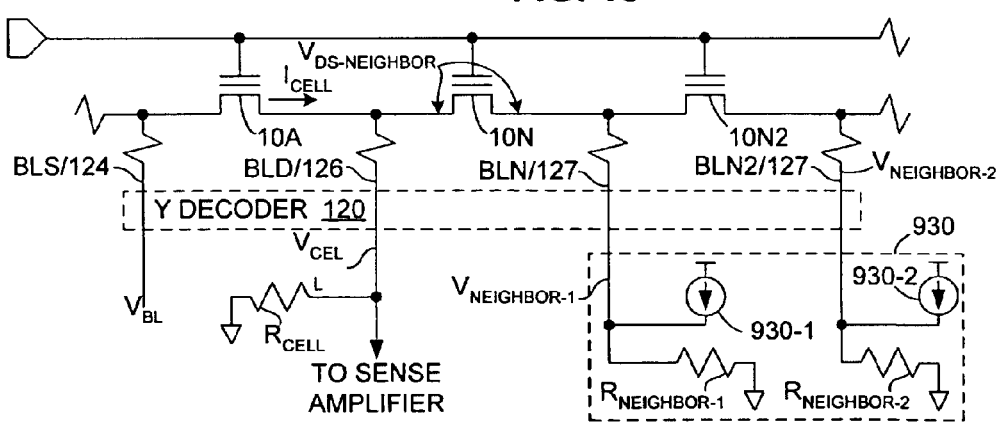
FIG. 11 is a simplified schematic diagram showing an equivalent memory array circuit generated during a read phase of the dc sensing procedure of the present invention.

At the beginning of the development phase, bit line BLD is coupled to voltage source $V_{BL}$, and second bit line BLS is coupled to the first input terminal of the sense amplifier 940 via signal line 926. In addition, third bit line BLN is coupled to current source 930 (signal line 927). Also, a high voltage signal is applied to word line WLA. The resulting equivalent circuit (greatly simplified) is shown in FIG. 11. Under these conditions, a current $I_{CELL}$ flows through selected NVM cell 10A, and a corresponding cell signal $V_{CELL}$ begins to develop across cell resistor $R_{CELL}$ at a rate determined mainly by the programmed/erased state of selected NVM cell 10A and the size of the cell resistor. For example, as indicated in FIG. 10, when selected NVM cell 10A is erased, an erased cell voltage $V_{CELL-ERASED}$ develops at a relatively fast rate, and stabilizes after a brief time period at a relatively high voltage level $V_1$. Under the same conditions, when selected NVM cell 10A is programmed, a programmed cell voltage $V_{CELL-PROGRAMMED}$ develops at a relatively slow rate, and stabilizes after a brief time period at a relatively low voltage level $V_2$. Note also that reference cell $10_{REF}$ is turned on at the beginning of the development phase, and that reference signal $V_{REF}$ develops at a rate that is between the expected programmed and erased development rates associated with selected cell 10A, and stabilizes at a voltage $V_3$ that is between erased cell voltage $V_1$ and programmed cell voltage $V_2$.

The dc sensing method then enters the read phase at a suitable time T2 (FIG. 10) that is selected to allow sufficient time for cell signal $V_{CELL}$ to settle. At this point cell signal $V_{CELL}$ is compared with reference signal $V_{REF}$, and an output signal $V_{OUT}$ is generated that indicated the relationship between cell signal $V_{CELL}$ and reference signal $V_{REF}$, thereby indicating the programmed/erased state of selected cell 10A.

Although the dc measurement method allows time for cell signal $V_{CELL}$ to stabilize before the reading phase, the additional capacitance produced by the neighbor effect may cause erroneous readings. For example, as indicated by the dashed line in FIG. 10, if neighbor cell 10N (FIG. 9) and zero or more additional neighbor cells (e.g. cell 10N2; FIG. 9) are erased, current drain through these erased neighbor cells may produce a slow-developing cell voltage $V_{CE}$ that remains below reference voltage $V_{REF}$ at the beginning of the read phase, thereby producing an erroneous "cell programmed" reading.

To prevent the neighbor effect from generating a false "cell programmed" reading using the dc sensing method, a forced neighbor signal $V_{NEIGHBOR}$ is generated by current source 930 (FIG. 9) such that the voltage across neighbor NVM cell 10N (i.e., drain-source voltage $V_{DS-NEIGHBOR}$; FIG. 11) is minimized during the development and reading phases of the dc sensing procedure. In accordance with one specific embodiment, neighbor resistor $R_{NEIGHBOR}$ and current source 930 are selected (or "tuned") such that the current associated with the forced neighbor signal ($I_{NEIGHBOR}$) is equal to the current $I_{REF}$ generated through reference cell $10_{REF}$ (shown in FIG. 9). Accordingly, when the threshold voltage of selected NVM cell 10A equals the threshold voltage of reference cell $10_{REF}$, the drain-to-source voltage $V_{DS-NEIGHBOR}$ is zero volts. In this manner, the neighbor effect is minimized and/or eliminated in the dc sensing method in a manner similar to that described above with reference to the close-to-ground measuring method, with similar benefits being produced.

As indicated at the right side of FIG. 11, according to another aspect of the present invention, current source 930 includes two physical current sources 930-1 and 930-2 and associated neighbor resistors RNEIGHBOR-1 and RNEIGHBOR-2, with second physical current source 930-2 coupled to bit line BLN2 during the development and reading phases. As discussed above, the additional forced neighbor signal further reduces the occurrence of the neighbor effect.

Although the invention has been described in connection with several embodiments, it is understood that this invention is not limited to the embodiments disclosed, but is capable of various modifications that would be apparent to a person skilled in the art. Thus, the invention is limited only by the following claims.

What is claimed is:

1. A method for sensing a programmed/erased state of a selected non-volatile memory (NVM) cell within a memory array, the memory array including a first bit line connected to a first terminal of the selected NVM cell, a second bit line connected to a second terminal of the selected NVM cell, a second NVM cell having a first terminal connected to the second bit line, and a third bit line connected to a second terminal of the second NVM cell, the method comprising:

during a first phase, coupling the first bit line to a first voltage source having a first non-zero voltage level, and coupling the second and third bit lines to a ground source;

during a second phase beginning at an end of the first phase:

decoupling the second bit line from the ground source, whereby a sensed cell signal develops on the second bit in response to a cell current passing through the selected NVM cell from the first bit line, and decoupling the third bit line from the ground source, and then coupling the third bit line to a current source such that a forced neighbor signal is generated on the third bit line; and during a third phase subsequent to the second phase and before the sensed cell signal is stabilized, comparing the sensed cell signal generated on the second bit line with a reference signal to determine the programmed/erased state of the selected NVM cell.

2. The method according to claim 1, wherein a programmed/erased state of the selected NVM cell controls a current through the sensed cell signal during the second and third phases such that a first, relatively small current is generated on the second bit line when the selected NVM cell is programmed, and a second, relatively large current is generated on the second bit line when the selected NVM cell is erased, and wherein coupling the third bit line to the current source comprises generating a third current that is between the first and second currents.

3. The method according to claim 1, wherein coupling the third bit line to the current source comprises generating the forced neighbor signal such that, at a selected time during the third phase, an instantaneous voltage level of the forced neighbor signal is within a range defined by one-half of the reference signal and 1.5 times the reference signal.

4. The method according to claim 3, wherein coupling the third bit line to the current source comprises generating the forced neighbor signal such that, at the selected time during the third phase, the forced neighbor signal is substantially equal to the reference signal.

5. The method according to claim 1, wherein the memory array further comprises a third NVM cell having a first terminal connected to the third bit line and a fourth bit line connected to a second terminal of the third NVM cell, and wherein the method further comprises:

coupling the fourth bit line to the ground source during the first phase; and decoupling the fourth bit line from the ground source, and coupling the fourth bit line to the current source during the second and third phases.

6. The method according to claim 1,
wherein the memory array further comprises a third NVM cell having a first terminal connected to the third bit line and a fourth bit line connected to a second terminal of the third NVM cell, and
wherein the method further comprises:
coupling the fourth bit line to the ground source during the first phase; and decoupling the fourth bit line from the ground source, and coupling the fourth bit line to a second current source during the second and third phases such that a second forced neighbor signal is generated on the fourth bit line, wherein the second forced neighbor signal is substantially equal to the forced neighbor signal generated on the third bit line.

7. A method for sensing a programmed/erased state of a selected non-volatile memory (NVM) cell within a memory array, the memory array including a first bit line connected to a first terminal of the selected NVM cell, a second bit line connected to a second terminal of the selected NVM cell, a second NVM cell having a first terminal connected to the second bit line, and a third bit line connected to a second terminal of the second NVM cell, the method comprising:
during a first phase, coupling the first bit line to a first voltage source having a first non-zero voltage level, and coupling the second and third bit lines to a ground source;
during a second phase beginning at an end of the first phase:
decoupling the second bit line from the ground source, whereby a sensed cell signal develops on the second bit in response to a cell current passing through the selected NVM cell from the first bit line, and
decoupling the third bit line from the ground source, and coupling the third bit line to a forced neighbor signal such that a voltage level increases on the third bit line from ground to at a predetermined rate; and
during a third phase subsequent to the second phase, and before the voltage level on the third bit line has reached a maximum voltage level, comparing the sensed cell signal generated on the second bit line with a reference signal to determine the programmed/erased state of the selected NVM cell.

8. The method according to claim 7,
wherein a programmed/erased state of the selected NVM cell controls a current through the sensed cell signal during the second and third phases such that the sensed cell signal increases from ground to the first voltage level at a first, relatively slow rate when the selected NVM cell is programmed, and increases from ground to the first voltage level at a second, relatively fast rate when the selected NVM cell is erased, and
wherein coupling the third bit line to the forced neighbor signal comprises causing the predetermined rate of the voltage level on the third bit line to be between the first and second rates.

9. The method according to claim 7, wherein coupling the third bit line to the forced neighbor signal comprises generating the voltage level on the third bit line such that, at a selected time during the third phase, the voltage level is within a range defined by one-half of the reference signal and 1.5 times the reference signal.

10. The method according to claim 9, wherein coupling the third bit line to the forced neighbor signal comprises generating the voltage level on the third bit line such that, at the selected time during the third phase, the voltage level is substantially equal to the reference voltage.

11. The method according to claim 7,
wherein the memory array further comprises a third NVM cell having a first terminal connected to the third bit line and a fourth bit line connected to a second terminal of the third NVM cell, and
wherein the method further comprises:
coupling the fourth bit line to the ground source during the first phase; and decoupling the fourth bit line from the ground source, and coupling the fourth bit line to the forced neighbor signal during the second and third phases.

12. The method according to claim 7,
wherein the memory array further comprises a third NVM cell having a first terminal connected to the third bit line and a fourth bit line connected to a second terminal of the third NVM cell, and
wherein the method further comprises:
coupling the fourth bit line to the ground source during the first phase; and decoupling the fourth bit line from the ground source, and coupling the fourth bit line to a second forced neighbor signal during the second and third phases, wherein the second forced neighbor signal is substantially equal to the forced neighbor signal generated on the third bit line.

13. A memory circuit comprising:
a memory array including a first non-volatile memory (NVM) cell, a first bit line connected to a first terminal of the first NVM cell, a second bit line connected to a second terminal of the first NVM cell, a second NVM cell having a first terminal connected to the second bit line, and a third bit line connected to a second terminal of the second cell;
a switching circuit connected between each of the first, second and third bit lines and a first voltage source having a first voltage level, a ground source, a sense amplifier, and a secondary signal source; and
means for controlling the switching circuit such that:
during a first phase, the first bit line is coupled to the first voltage source, and the second and third bit lines are coupled to the ground source; and
at the end of the first phase, the second bit line and the third bit line are decoupled from the ground source, the second bit line is coupled to the sense amplifier, the third bit line is coupled to the secondary signal source, and a gate voltage is applied to the gate terminals of the first NVM cell and the second NVM cell, thereby causing a cell current to pass through the first NVM cell and to produce a sensed cell signal on the second bit line that increases from ground to the first voltage level at a development rate determined by the programmed/erased state of the selected NVM cell,
wherein the secondary signal source generates a forced neighbor signal on the third bit line such that a voltage level on the third bit line increases from ground at a second rate that is similar to the development rate.

14. The memory circuit according to claim 13, wherein said control means further comprises means for comparing the sensed cell signal generated on the second bit line with a reference signal to determine the programmed/erased state of the selected NVM cell before the forced neighbor signal has reached a maximum voltage level.

15. The memory circuit according to claim 13,
wherein the switching circuit further comprises a decoder circuit having a first set of terminals connected to each of the first, second and third bit lines, and a second set of terminals including a first terminal connected to the first voltage source via a first signal line, a second terminal connected to the sense amplifier via a sensing line, and a third terminal connected to the current source via a second signal line, and wherein the first and second signal lines are selectively coupled to ground via a first transistor and a second transistor, respectively.

16. The memory circuit according to claim 15, wherein the first and second transistors are connected to receive a first control signal such that the first and second transistors are turned on simultaneously.

17. The memory circuit according to claim 13, further comprising:

a third NVM cell having a first terminal connected to the third bit line and a fourth bit line connected to a second terminal of the third NVM cell, and wherein the controlling means further comprises:

means for coupling the fourth bit line to the first voltage source during the first phase; and means for decoupling the fourth bit line from the ground source, and coupling the fourth bit line to the secondary signal source at the end of the first phase.

18. The memory circuit according to claim 13, wherein the secondary signal source comprises a current source.

19. The memory circuit according to claim 13, wherein the secondary signal source comprises a voltage source connected to a resistor.

20. The memory circuit according to claim 13, wherein the secondary signal source comprises a third NVM cell.

21. A method for sensing a programmed/erased state of a selected non-volatile memory (NVM) cell within a memory array, the memory array including a first bit line connected to a first terminal of the selected NVM cell, a second bit line connected to a second terminal of the selected NVM cell, a second NVM cell having a first terminal connected to the second bit line, and a third bit line connected to a second terminal of the second NVM cell, the method comprising:

during a development phase:
  coupling the first bit line to a voltage source,
  coupling the second bit line to a sense amplifier,
  coupling the third bit line to a force neighbor signal source, and
  applying a gate voltage to the first and second NVM cells, whereby a current flows through the first NVM cell to generate a cell signal on the first terminal of the second NVM cell that develops at a first rate; and during a read phase subsequent to the development phase, determining a programmed/erased state of the selected non-volatile memory cell by causing the sense amplifier to compare the cell voltage developed on the first bit line with a reference voltage, wherein the forced neighbor signal source is selected such that a forced neighbor signal develops on the third bit line at a second rate similar to the first rate such that a voltage across the second NVM cell is minimized during the development phase.

22. The method according to claim 21, wherein the memory array also includes a reference cell having a first terminal connected to the voltage source and a second terminal connected to a second input terminal of the sense amplifier, and a third resistor connected between the second terminal of the reference cell and the ground source, and wherein the method further comprises turning on the reference cell during the development phase such that a reference current is generated through the third resistor, thereby causing the reference voltage to develop on the second terminal of the sense amplifier.

23. The method according to claim 21, further comprising, during the development phase:

coupling the second bit line to a first terminal of a first resistor, the first terminal of the first resistor also being connected to a first input terminal of the sense amplifier, wherein the first resistor includes a second terminal connected a ground source, and coupling the third bit line to a first terminal of a second resistor, the first terminal of the second resistor also being connected to the forced neighbor signal source, wherein the second resistor includes a second terminal connected the ground source, wherein the second resistor and the forced neighbor signal source are selected such that a forced neighbor current is generated on the third bit line that is equal to the reference current flowing through the third resistor.

24. The method according to claim 21, further comprising, during the development phase:

coupling the second bit line to a first terminal of a first resistor, the first terminal of the first resistor also being connected to a first input terminal of the sense amplifier, wherein the first resistor includes a second terminal connected a ground source, and coupling the third bit line to a first terminal of a second resistor, the first terminal of the second resistor also being connected to the forced neighbor signal source, wherein the second resistor includes a second terminal connected the ground source, wherein the second resistor and the forced neighbor signal source are selected such that, when the threshold voltage of the selected NVM cell equals the threshold voltage of the reference cell, the drain-to-source voltage across the neighbor cell is zero.

* * * * *